United States Patent [19]

Gutentag

[11] Patent Number: 5,524,765
[45] Date of Patent: Jun. 11, 1996

[54] CARRIER TAPE PACKAGING SYSTEM UTILIZING A LAYER OF GEL FOR RETAINING SMALL COMPONENTS

[75] Inventor: Charles Gutentag, Los Angeles, Calif.

[73] Assignee: Tempo G, Los Angeles, Calif.

[21] Appl. No.: 339,790

[22] Filed: Nov. 15, 1994

[51] Int. Cl.$^6$ .................................................. B65D 73/02
[52] U.S. Cl. ............................ 206/713; 206/716; 206/813
[58] Field of Search ..................................... 206/713, 714, 206/716, 460, 486, 813

[56] References Cited

U.S. PATENT DOCUMENTS

| | | |
|---|---|---|
| 2,885,849 | 5/1959 | Wohlman, Jr. . |
| 3,177,629 | 4/1965 | Anspach . |
| 3,608,711 | 9/1971 | Wiesler et al. . |
| 3,691,436 | 9/1972 | Maijers et al. . |
| 3,785,507 | 1/1974 | Wiesler et al. . |
| 3,881,245 | 5/1975 | Dudley et al. . |
| 3,971,193 | 7/1976 | Tardiff et al. . |
| 4,298,120 | 11/1981 | Kaneko et al. . |
| 4,340,774 | 7/1982 | Nilsson et al. . |
| 4,406,367 | 9/1983 | Bouwknegt . |
| 4,575,995 | 3/1986 | Tabuchi et al. . |
| 4,667,944 | 5/1987 | Althouse . |
| 4,711,014 | 12/1987 | Althouse . |
| 4,724,954 | 2/1988 | Sillner . |
| 4,778,326 | 10/1988 | Althouse et al. . |
| 4,954,207 | 9/1990 | Higuchi et al. . |
| 4,966,282 | 10/1990 | Kawanishi et al. ..................... 206/714 |
| 5,025,923 | 6/1991 | Okui ....................................... 206/714 |
| 5,343,363 | 8/1994 | Greeson et al. . |

*Primary Examiner*—Jacob K. Ackun
*Attorney, Agent, or Firm*—Thomas I. Rozsa; Tony D. Chen

[57] ABSTRACT

A carrier tape which includes a punched tape with a plurality of aperture cavities, and a backing tape having a thin flexible gel material between a pair of strips of parallel pressure sensitive adhesive material. The flexible gel material covers all of the aperture cavities of the punched tape, so that singulated die and other components with a single flat surface can be placed on the surface of the flexible gel layer to hold the die or other component precisely in place, even during handling or shipping. The gel layer has high resistance to shear forces (movements in X, Y and theta) yet minor resistance to peel forces (removal in the Z-axis). The die is retained within an aperture cavity and it is adhered to the thin flexible gel layer such that the small component is unable to move in the X, Y or theta directions. The gel layer holds the die in place securely while the carrier tape is moving during processing and prevents fallout or dislocation of the die during high speed automated processing.

43 Claims, 5 Drawing Sheets

CARRIER TAPE PACKAGING SYSTEM UTILIZING A LAYER OF GEL FOR RETAINING SMALL COMPONENTS

BACKGROUND OF THE INVENTION

1. Field of the Invention

The present invention relates to the field of automated packaging systems. More particularly, the present invention relates to the field of carrier tape packaging systems.

2. Description of the Prior Art

Generally, small components, such as integrated circuit (IC) chips or die sawn from silicon or GaAs wafers are particularly susceptible to damage by mechanical forces and by electro-static discharge. Mechanical stress to the IC chip or die can cause structural damage, including cracking, chipping and breaking of these extremely fragile and brittle components, thereby causing both patent and latent defects in their functionality. Therefore, it would be a significant advantage if the component such as IC wafer die and other devices with smooth flat surfaces could be packaged to facilitate automatic handling and removal from the package when needed in a manner to protect and avoid damage to these delicate components and simultaneously minimize electro-static charge buildup during automatic handling.

Carrier tape packaging systems are known in the prior art. Existing carrier tape packaging systems typically include an elongated double sided and flexible carrier tape which is made of paper or plastic. The flexible carrier tape has a multiplicity of punched cavities which are utilized for retaining small electronic components, such as surface mount devices (SMDs). Generally, heat sealed cover tapes, one on each side of the punched carrier tape, are used to retain components within the punched cavities.

Another existing prior art system for retaining small components within the carrier tape is to use an embossed plastic carrier, aka blister tape. Small tub-like cavities are thermoformed into a strip of plastic. The small components are respectively placed into the cavities, and the cavities are covered with a heat sealed cover tape. The heat sealed cover tape encloses the cavities which contain the small components.

The inherent characteristics of both punched and embossed conventional carrier tapes provide that the small components are loose in the punched or embossed cavity. While they are retained within the recess of the cavity, the small components are free to move. When the top cover tape is removed by peel back, vibrations are induced which can cause the small components to move out of their required orientation or jump out of the cavity. In addition, very small components can and will adhere to the cover tape because of static electric charge buildups generated during the cover tape peel back and thereby not be available for automatic retrieval from their cavities. Furthermore, these static electric charges, however slight, can damage or destroy active electronic components through electro-static discharge (ESD).

A classic problem with conventional carrier tapes is that the peel-back of cover tape creates adverse vibrations on the carrier tape. These vibrations are particularly troublesome with extremely small lightweight components, the position of which can be disturbed by these vibrations. Another problem is that it is impossible to heat seal the cover tapes with total uniformity. This irregular seal causes 'spikes' during peel back which result in vibration and component disorientation. Vibration forces of as little as 0.05 newton have been known to cause components to jump out of their cavities or assume positions whereby retrieval using vacuum probe nozzles is not possible. In addition, static charge buildups which frequently occur when the cover tape is peeled back attract the small, light weight components which will frequently cling to the cover tape and be withdrawn from or dislodged within the carrier tape cavity. Still another problem with the cover tape is that the static charges which can build up on the cover tape during peel back can be released as a sudden burst and applied to one or more small active components such as bare die which are highly susceptible to ESD damage. Electro-static discharge applied to small components such as integrated circuit chips or die can cause reliability concerns and catastrophic failure.

Another existing prior art means for housing the small components is to use a punched paper carrier tape, as contrasted with a plastic, both used in conjunction with top and bottom cover tapes. In addition to the problems discussed above resulting from the usage of cover tape, the paper carrier tape creates problems due to dust and lint which are generated when the cover tape is pulled off the paper carrier tape surface. The paper carrier tape can delaminate when the top cover tape is pulled off, resulting in sudden separation of a length of cover tape from the carrier with subsequent component spillage. In the case of bare IC chips or die, use of paper carrier is strictly prohibited because of contamination concerns.

In another existing prior art system, the carrier tape has a multiplicity of apertures and a single length of pressure sensitive tape at the bottom and no cover tape. Small components are individually placed into the aperture of the carrier tape on the adhesive. When the components are removed from the adhesive surface, a vacuum tip is usually employed to remove and carry the component. Excessive adhesive strength in the component to adhesive bond can make separation of the component from the adhesive surface difficult. A sharp poke-up needle is sometimes used to release the component from the adhesive in coordination with the action of the vacuum tip. It is often awkward to use the poke-up needles to release the small components because the poke-up needles cannot directly engage with the small components and they sometimes exert unbalanced mechanical force to the small component as they push through the adhesive bottom. A small portion of the adhesive may adhere to the IC or other small component after it is removed from the carrier tape and the adhered adhesive causes problems when the component is placed on a printed circuit board or other mounting surface. Finally, with a film backing of pressure sensitive tape to contend with, a poke-up needle encounters considerable resistance as it tries to penetrate the adhesive backing and push the IC or other small component out of the carrier tape. Fine pointed needles are required to penetrate the film backing of the pressure sensitive tape. However, these fine pointed needles expose components to physical damage, and frequently break during repeated use, resulting in production downtime and increased probability of adhesive retention on the component.

The applicant of this application is also the inventor of the invention claimed in U.S. Pat. No. 5,203,143 issued to Gutentag on Apr. 20, 1993 for "Multiple And Split Pressure Sensitive Adhesive Stratums For Carrier Tape Packaging System", where the carrier tape utilizes two split PSA tapes, instead of one, on the bottom side of the embossed carrier tape. Adjusting the gap between the two PSA tapes provides precise adjustment of the firmness of the adhesion between the small component and the two PSA tapes. The applicant desires to develop a carrier tape system which does not utilize pressure sensitive adhesive material to hold the small components and does not require poke-up needles or other push-up tools for removal of the small components.

The following sixteen (16) prior art patents were uncovered in the pertinent field of the present invention:

1. U.S. Pat. No. 2,885,849 issued to Wohlman, Jr. on May 12, 1959 for "Semiconductor Taping Apparatus" (hereafter "the Wohlman Patent");
2. U.S. Pat. No. 3,177,629 issued to Anspach on Apr. 13, 1965 for "Apparatus for Loading Components" (hereafter "the Anspach Patent");
3. U.S. Pat. No. 3,608,711 issued to Wiesler et al. on Sep. 28, 1971 for "Package For Electronic Devices And The Like" (hereafter "the '711 Wiesler Patent");
4. U.S. Pat. No. 3,691,436 issued to Maijers et al. on Sep. 12, 1972 for "Electrical Circuit Element Having A Diagonal Abutment Strip, And Method Of Manufacturing the Same" (hereafter "the Maijers Patent");
5. U.S. Pat. No. 3,785,507 issued to Wiesler et al. on Jan. 15, 1974 for "Die Sorting System" (hereafter "the '507 Wiesler Patent");
6. U.S. Pat. No. 3,881,245 issued to Dudley et al. on May 6, 1975 for "Mounting Electrical Components On Thick Film Printed Circuit Elements" (hereafter "the Dudley Patent");
7. U.S. Pat. No. 3,971,193 issued to Tardiff et al. on Jul. 27, 1976 for "Machines For Sequencing Diverse Components" (hereafter "the Tardiff Patent");
8. U.S. Pat. No. 4,298,120 issued to Kaneko et al. on Nov. 3, 1981 for "Chip-Like Electronic Component Series And Method For Supplying Chip-Like Electronic Components" (hereafter "the Kaneko Patent");
9. U.S. Pat. No. 4,340,774 issued to Nilsson et al. on Jul. 20, 1982 for "Device for Mounting Circuit Components On A Circuit Board" (hereafter "the Nilsson Patent");
10. U.S. Pat. No. 4,406,367 issued to Bouwknegt on Sep. 27, 1983 for "Package For Electrical And/Or Electronic Components" (hereafter "the Bouwknegt Patent");
11. U.S. Pat. No. 5,343,363 issued to Greeson et al. on Aug. 30, 1994 for "SPLIT BACKED PRESSURE SENSITIVE DIE CARRIER TAPE". (hereafter "the Greeson Patent");
12. U.S. Pat. No. 4,575,995 issued to Tabuchi et al. on Mar. 18, 1986 for "Automatic Producing Apparatus Of Chip-Form Electronic Parts Aggregate" (hereafter "the Tabuchi Patent");
13. U.S. Pat. No. 4,667,944 issued to Althouse on May 26, 1987 for "Means For Handling Semiconductor Die And The Like" (hereafter "the '944 Althouse Patent");
14. U.S. Pat. No. 4,711,014 issued to Althouse on Dec. 8, 1987 for "Means For Handling Semiconductor Die And The Like" (hereafter "the '014 Althouse Patent");
15. U.S. Pat. No. 4,724,954 issued to Sillner on Feb. 16, 1988 for "System For Conveying And Guiding Components, In Particular Electrical Construction Elements Which Are Held On A Belt In A Radially Or Quasi-Radially Belted Manner" (hereafter "the Sillner Patent");
16. U.S. Pat. No. 4,778,326 issued to Althouse et al. on Oct. 18, 1988 for "Means For Handling Semiconductor Die And Similar Electronic Devices" (hereafter "the '326 Althouse Patent"); and
17. U.S. Pat. No. 4,954,207 issued to Higuchi et al. on Sep. 4, 1990 for "Apparatus For Automatically Taping Electronic Components" (hereafter "the Higuchi Patent").

The Wohlman Patent discloses a semiconductor taping apparatus. The semiconductors are taped at lateral ends by a first pair of tapes, and a second pair of tapes where the first pair of tapes face the adhesive side of the tapes in the second pair of tapes.

The Anspach Patent discloses an apparatus for loading components. These components are primarily larger components which are leaded diodes. There is a gap in the carrier where the heads of the transistors are placed but the transistors themselves are carried by having the lead sandwiched between the carrier tape and an adhesive tape.

The '711 Wiesler Patent discloses a package for electronic devices and the like, which utilizes a tape with a plurality of openings in the tape to receive a device. The device is held in place by an adhesive tape, applied from the back, which is exposed at the opening and serves as a tape stratum for holding the device in place.

The Maijers Patent discloses an electrical circuit element having a diagonal abutment strip and method of manufacturing the same. Small discrete components are interconnected by means of a strip of tape.

The '507 Wiesler Patent discloses a die sorting system which uses a strip comprised of a relatively narrow strip formed with indexing holes along one edge, and storage holes adjacent the outer edge of the strip. On the bottom side, a thin pressure sensitive adhesive tape is laminated to the strip and provides an adhesive floor, to hold the die, at the bottom of the storage holes.

The Dudley Patent discloses a device for mounting electrical components on thick film printed circuit elements. Two metal strips are attached to printed areas, adhered by electrical resistance welding for contacting electrodes.

The Tardiff Patent discloses machines for sequencing diverse components. Small electrical components are sequenced and interconnected with a tape at opposite ends of their lead portions.

The Kaneko Patent discloses a chip-like electronic component series and method for supplying chip-like electronic components, comprising a tape-like member formed with a plurality of apertures with upper and lower cover sheets that contain small chip-like electronic components.

The Nilsson Patent discloses a device for mounting circuit components on a circuit board which include apertures in the plate designed to hold by means of a friction fit.

The Bouwknegt Patent discloses a strip-shaped carrier having apertures for retaining small components. The small components are held therein by two adhesive tapes, which partially cover the apertures on the carrier. This leaves part of the component in the aperture exposed so that an ejector can engage the component to press it out of the aperture. A similar technology is disclosed in the Greeson Patent.

The Tabuchi Patent discloses an automatic producing apparatus of chip-form electronic parts aggregate. There is a tape-like housing body formed by the automatic producing apparatus. The tape-like housing body has a feed hole along the side and a frame type housing hole with a specific pitch between the housing holes. There is a tape covering which essentially covers the entire portion of the carrying tape.

The '944 Althouse Patent discloses an apparatus for handling semiconductor chips and the like objects. It includes a carrier which has a base member with an upper face covered by a pervious texturized sheet. A thin flexible sheet covers the pervious texturized sheet and extends outwardly beyond the perimeter thereof in sealing engagement with the base member. The chips are supported on the upper face of the thin flexible sheet in full surface contact with the thin sheet, and interfacial forces tightly hold the chips in position on the thin sheet. The thin sheet is drawn downwardly into interstices or crevices, in the face of the pervious texturized sheet by reducing the gas pressure at the pervious texturized sheet thereby reducing the surface contact between the chip and the thin sheet which, in turn, reduces the force by which the chip is attached to the thin sheet.

The '014 Althouse Patent discloses a method of handling semiconductor chips and the like objects. The '014 Althouse Patent is exactly the same as the '944 Althouse Patent. The '014 Althouse Patent discloses a method of attaching an object to the thin flexible sheet and drawing the portions of the thin flexible sheet into interstices between the crossovers by connection of the pervious texturized sheet to a vacuum source such that the portions of the thin sheet are withdrawn from the object, and thereby remove the object from the thin flexible sheet.

The Sillner Patent discloses a system for conveying and guiding components, in particular electrical construction elements which are held on a belt in a radially or quasi-radially belted manner. The components are also held by a tape at the ends of their leads.

The '326 Althouse Patent discloses a method and means for handling semiconductor and similar electronic devices. It includes a carrier which has a base member having an upper face formed with recess means inside the perimeter thereof. A thin flexible film is supported on the upper face of the base member in sealing engagement. The chips are supported on the thin flexible film in full surface contact with the film. To remove the chips from the film, the film is drawn downwardly into the recess means by reducing the gas pressure in the recess means thereby reducing the surface contact between the chip and the film which, in turn, reduces the force by which the chip is attached to the film.

The Higuchi Patent discloses an apparatus for automatically taping electronic components. The electronic components are placed on an elongated tape body at a regular pitch and an adhesive tape is applied to fix the electronic components in position. One of the main points of the Higuchi Patent is that the electronic component is placed on an elongated first tape and by applying a second tape, the component is fixed between the two tapes.

It is highly desirable to have a very efficient and also very effective design and construction of an improved carrier tape packaging system for receiving, retaining and releasing small components. The carrier tape does not retain small components by pressure sensitive adhesive (PSA) material, does not use poke-up needles for removal of the small components, and does not contain a top cover tape to retain components within their respective cavities. Therefore, the improved carrier tape can eliminate the problems associated with the use of PSA material, poke-up needles, and top cover tapes.

SUMMARY OF THE INVENTION

The present invention is a carrier tape packaging system for small components or dies. The carrier tape includes a punched tape with a plurality of aperture cavities, a non-adhesive elastomeric film comprising a thin flexible gel layer material, and a non-porous, air impermeable flexible backing tape. A pair of strips of parallel pressure sensitive adhesive (PSA) material are affixed to the backing tape with the thin flexible gel layer located between the pair of strips of parallel sensitive adhesive material and, set onto the underneath surface of the punched tape, such that the flexible gel material covers all of the aperture cavities of the punched tape, so that the die can be placed onto the surface of the flexible gel layer which holds the die precisely in place, even during handling or shipping.

The novel feature of the present invention carrier tape is to have the thin flexible gel layer retaining small components within the aperture cavity of the punched tape. The characteristics of the gel material extend high resistance to shear forces (movements in X, Y and theta) yet minor resistance to peel forces (removal in the Z-axis), such that the gel material offers benefits beyond that of pressure sensitive adhesive tapes used for holding small components.

When a very small flat component, such as an IC wafer die is retained within a carrier tape cavity, it is adhered to the flexible gel layer such that the small component is restricted from movement in the X, Y or theta directions. To a much less yet sufficient extent to assure retention during automatic handling, the small component movement is restricted in the Z-axis direction. The gel layer retains the small component in place securely while the carrier tape is moving during the reeling and de-reeling actions of automatic handling and prevents accidental dislocation or fallout of the small component during high speed automated processing.

The primary means for removal of the small flat component from the aperture cavity is accomplished by use of an upper vacuum pipette or suitable mechanical equivalent lifting means, working in conjunction with an intermittent lower vacuum chamber at a fixed component pick point. The lower vacuum chamber, by means of suction, withdraws the backing tape and deforms the flexible gel layer, thereby releasing most but not all of the gel surface in contact with the small flat component, while the upper vacuum pipette or equivalent mechanical lifting means withdraws and raises the small component out of the aperture cavity where it was held by the flexible gel layer.

It has been discovered, according to the present invention, that by providing a carrier tape which has a punched tape and a backing tape with a thin flexible gel layer affixed between the punched tape and the backing tape, the flexible gel layer provides means for receiving and retaining small components in a carrier tape aperture cavity and has the capability of restricting small components from shear movements in the X, Y or theta directions and to a lesser extent peel movement in the Z-axis direction, especially when the majority of the gel surface is withdrawn from the flat component surface by vacuum action.

It has also been discovered, according to the present invention, that by providing a carrier tape which comprises a punched tape and a backing tape with a thin flexible gel layer between the punched tape and the backing tape, the flexible gel layer will provide means for releasing small flat components when the majority of the gel surface is withdrawn by vacuum action from the flat component surface.

It has been additionally discovered, according to the present invention, that by utilizing a thin flexible gel layer with a punched tape for retaining small flat components, poke-up needles or other push-up tools to assist removal of the component from the carrier tape aperture cavity are not required.

It has further been discovered, according to the present invention, that by utilizing a thin flexible gel layer with a punched tape having a plurality of aperture cavities for receiving, retaining and releasing small components, the aperture cavity of maximum size can be employed to retain a range of component sizes. This requirement for specific sizing is apparent because the sidewalls of each aperture cavity in conventional punched and embossed carrier tapes are the only means which serve to restrict X, Y and theta movements of the small component which is loose and free to move within the aperture cavity. The use of the flexible gel layer to secure components within aperture cavities of the punched tape negates the need for the sidewalls of the aperture cavity to serve as means for component orientation. In practice, the component is placed on the flexible gel layer and accurately centered and oriented within the aperture cavity and never contacts the sidewalls of the aperture cavity, resulting in two principal benefits: (a) a single aperture cavity size can be used for multiple component sizes, resulting in standardization and reduction in total variety and costs of carrier tapes needed for a range of component sizes; and (b) the additional size of the overall aperture cavity permits ready access of a vacuum probe, a die collet or an array of gripper jaws of required size to pick up the component which is generally below the top surface of the cavity in the carrier tape.

It has additionally been discovered, according to the present invention, that use of a thin flexible gel layer in conjunction with a punched tape for retaining small flat components can avoid damage to a bottom-side coating used on some small components such as singulated bare IC chips or die, as well as to the extremely fragile surface of bare die which may be taped in an inverted 'face-down' position to facilitate a C4 flip chip assembly to the substrate. In such instances, the use of a poke-up needle or other tool which would be used to raise the IC chip or die from a pressure sensitive adhesive tape and thereby make contact with the component would almost surely damage the component surface and render it unusable due to a combination of patent and latent defects. When the component is affixed to the thin flexible gel layer, the component may be removed by deflecting the majority of the gel contact surface away from the component surface by vacuum means to allow ready pickup and removal of the component from the carrier tape cavity using a vacuum pipette or other suitable mechanical means.

It has further been discovered, according to the present invention, that use of a thin flexible gel layer in conjunction with a punched tape for retaining small flat components is capable of multiple uses as a component storage and delivery system. Conversely, similar carrier tapes employing pressure sensitive adhesive means to retain components therein are generally suitable for one-time use only since the PSA surface loses adhesion and often migrates when the first component placed thereon is removed, thereby precluding effective reuse. With increasing emphasis upon environmental concerns, such reuse of carrier tapes employing a thin flexible gel layer will impact most favorably, particularly because most carrier tapes are impractical to recycle due to the dissimilar materials contained therein.

It has additionally been discovered, according to the present invention, that use of a thin flexible gel layer in conjunction with a punched carrier for retaining small flat components allows retention on the gel surfaces for indefinite time periods without fear of damage during subsequent removal. With pressure sensitive adhesive (PSA) retention means, IC wafer chips or die are often limited to a shelf life on a PSA substrate of two weeks maximum, especially where 100% of the surface of each die is in contact with the PSA. Characteristics of PSAs generally associated with bare IC wafer die are such that peel adhesion increases over time, as well as with environmental changes in temperature and humidity typically encountered during shipping and storage, thereby preventing clean, undamaged release of die from the PSA stratum and usually resulting in fractures, chipping, or total cleavage of the die during the removal process. On the other hand, peel adhesion characteristics of a gel surface are not significantly changed over time or by temperature or humidity variations experienced during shipping and storage. Accordingly, the gel surface means for component retention provides the benefits of long term storage and exposure to earthly environmental extremes without detracting from the ability to remove components, especially bare die, from the flexible gel in the aperture cavity of the punched carrier without damage.

It is therefore an object of the present invention to provide a carrier tape which has a punched tape with a plurality of aperture cavities and a backing tape with a thin flexible gel layer affixed between the punched tape and the backing tape; the flexible gel layer secures small components in the aperture cavity, so that the small components are restricted from shear movements in the X, Y or theta directions, but readily released in the Z-axis at point of pick-up by vacuum pipette or mechanical means.

It is also an object of the present invention to provide a carrier tape which has a punched tape with a plurality of aperture cavities and a backing tape with a thin flexible gel layer placed between the punched tape and the backing tape, so that the flexible gel layer receives, retains and releases small components. By providing a vacuum chamber or similar means for withdrawing the majority of the gel surface in contact with the component away from the component surface itself, the removal of the small components is more efficiently and accurately controlled due to a reduced resistance to component withdrawal in the Z-axis direction of the pick-up.

It is an additional object of the present invention to provide a thin flexible gel layer with a punched tape for retaining small components, so that the poke-up needles are eliminated in assisting in the removal of the small component from the pressure sensitive adhesive material.

It is a further object of the present invention to provide a maximum size of an aperture cavity of a punched tape which can be employed to retain a range of component sizes. This requirement for specific closely fitted sizing is apparent in conventional component carrier tapes, because the sidewalls of each aperture cavity are the only means which serve to restrict x, y and theta movement of the component which is loose and free to move within the aperture cavity. The use of the flexible gel layer to secure components within the aperture cavities of the punched tape negates the need for the sidewalls of the aperture cavity to serve as means for component orientation. In practice, the component is placed on the flexible gel layer and accurately centered within the aperture cavity. Accordingly, the small flat component never contacts the sidewall of the aperture cavity, resulting in two principal benefits: (a) a single aperture cavity size can be used for multiple component sizes, resulting in standardization and reduction in total variety and costs of carrier tapes needed for a range of component sizes; and (b) the additional size of the overall aperture cavity permits ready access of a vacuum probe or other mechanical means of required size to pick up the component which is generally below the top surface of the cavity in the carrier tape.

Described briefly, the present invention is a carrier tape which includes a punched tape, a thin flexible non-adhesive elastomeric film or gel and a non-porous, air-impermeable backing tape such as polyester or polyvinyl chloride (PVC).

The punched tape includes a plurality of small aperture cavities where each small aperture cavity is designated to contain a range of small component sizes of varied geometries within a total maximum envelope. The small aperture cavity has a boundary of the same general outline as the small component, although the aperture cavity may be substantially larger and of varied geometries to allow the component to be easily fitted within the aperture cavity and subsequently removed therefrom. The aperture cavity is designed such that the small component is completely surrounded by the punched tape boundary squarely about the side periphery of the small component. The thickness of the punched tape and the resulting depth of the aperture cavity easily may be at least as deep as, or slightly deeper than the height or thickness of the small component. By placing the small component into the aperture cavity of the punched tape, where the aperture cavity bounds the small component about the sides, a backing tape supports the base of the small components with a thin flexible gel layer affixed between the base of the small components and the backing tape, and the position and orientation of the small component is therefore fixed with respect to the punched tape. Accurately fixing the position of the small component with respect to the punched tape and specifically the cross-hair centerlines of each aperture cavity is an important consideration for subsequent automated handling in systems manufacturing.

In the present invention, a backing tape is used with two strips of spaced apart parallel pressure sensitive adhesive material affixed to the backing tape. A thin flexible gel layer is affixed to a middle portion the backing tape in the longitudinal direction, between the two strips of parallel PSA material. The backing tape is affixed to the punched tape, such that the flexible gel layer extends over the entire area of the aperture cavities of the punched tape, longitudinally, along the entire length of the punched tape. The aperture cavity remains open at the top and the flexible gel layer is exposed through the aperture cavity. The small component is then placed into the aperture cavity and is supported at its base from underneath by the gel layer and the backing tape.

In preparing for component removal, a lower vacuum chamber would be partially exhausted of atmospheric air and would suck or withdraw the flexible, air-impermeable backing tape so that the flexible gel layer is deformed and pulled away from the flat surface of the component thereon, and an upper vacuum pick-up tip or other mechanical means would take possession of the component and withdraw the component from the aperture cavity. Any significant resistance of the small component or reluctance to be vertically withdrawn from its aperture cavity can result in misalignment of the component with respect to the vacuum tip or complete failure to pick up the component (aka mispick) using the vacuum tip or other mechanical pick-up means.

In integrated circuit type small chip components, the die size can be less than ten (10) mils per side (where one mil is one thousandths of an inch). The thickness of the components can be less than five (5) or six (6) mils. The co-planarity of the small component top and bottom surfaces is generally very precise, and the precise, consistent and repeatable location and orientation of each small component is very important for the correct subsequent sequential engagement by the vacuum tip, or by a die collet or a set of gripping jaws which are arranged to engage the die from two or more sides for pick-up and removal from the aperture cavity, thereby avoiding surface contact with delicate and easily damaged IC circuitry on the face of the die.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
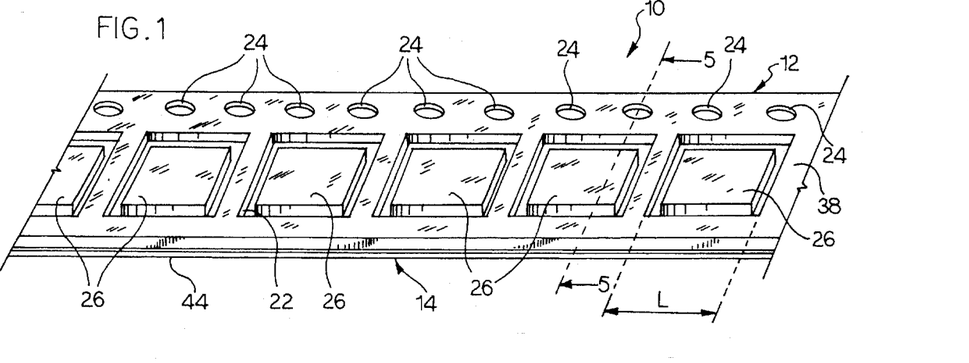
FIG. 1 is a perspective view of one embodiment of the present invention carrier tape packaging system with a punched tape having a plurality of aperture cavities wherein each aperture cavity is retaining a small component.
Figure 2:
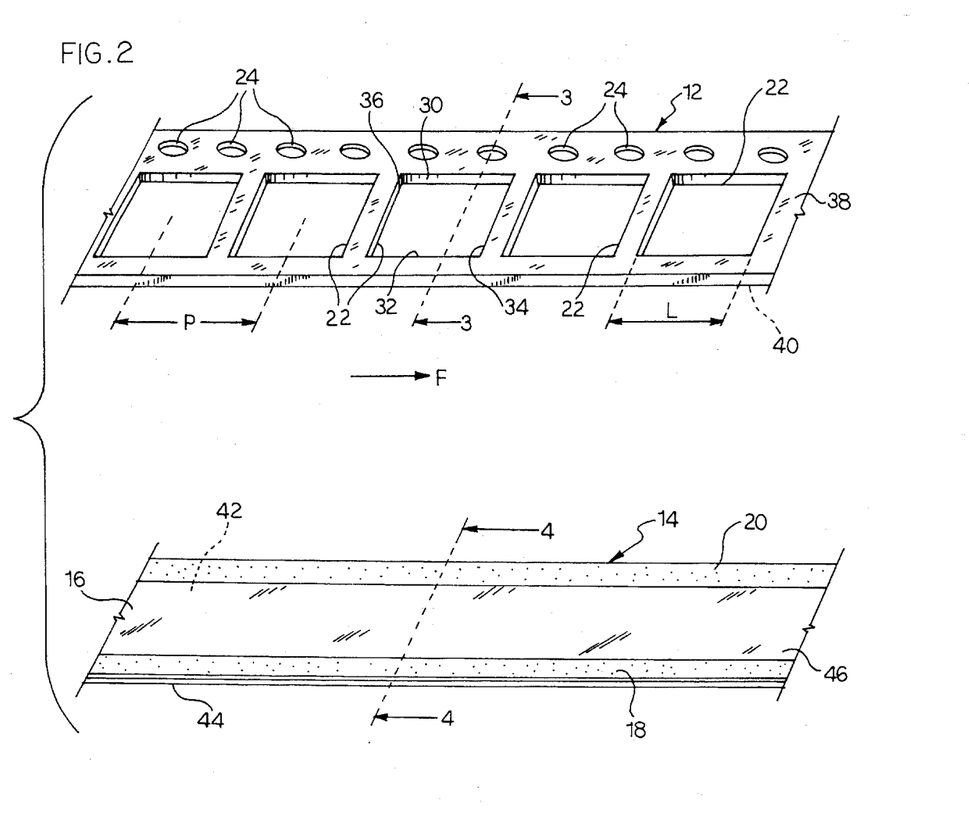
FIG. 2 is an exploded perspective view of the embodiment shown in FIG. 1.

FIG. 1 illustrates a perspective view of the preferred embodiment of the present invention longitudinal carrier tape 10 which has small components or dies 26 fitted into a plurality of aperture cavities 22. FIG. 2 illustrates an exploded perspective view of the present invention carrier tape 10 which includes a longitudinal punched tape 12 and a non-porous, air impermeable flexible longitudinal backing tape 14. A non-adhesive elastomeric film comprises a thin resilient flexible gel layer 16 which is affixed to the backing tape 14 and located between a pair of strips of parallel spaced apart pressure sensitive adhesive material 18 and 20.

Figure 3:
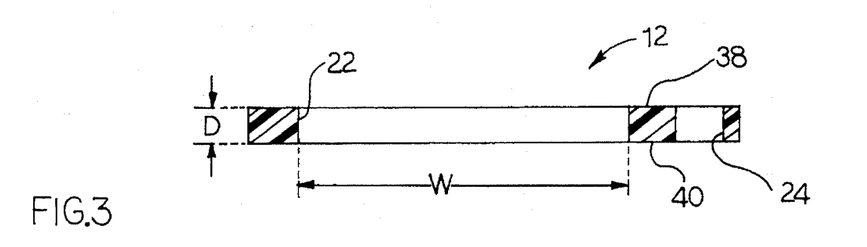
FIG. 3 is a cross-sectional view taken along line 3—3 of FIG. 2, showing the aperture cavity of the punched tape and a sprocket drive hole.

Referring to FIGS. 1, 2 and 3, the longitudinal punched tape 12 is a smooth ribbon like film, usually made of plastic or paper. The punched tape 12 has a front side 38, a back side 40 and a plurality of aperture cavities 22 which form a hexahedron volume region. The punched tape 12 thickness is the same as the thickness "D" of the aperture cavity 22. The length "L", width "W" and thickness "D" of an individual aperture cavity 22 is generally dependent on the pitch "P" of the aperture cavities 22 to the sprocket drive holes 24 as well as the nature and thickness of the component to be placed within the aperture cavity 22. The hexahedron volume region of the aperture cavities 22 on a 2 mm pitch "P" can have dimensions approximately sixty (60) mils in length, by one hundred twenty-five (125) mils in width, by ten (10) mils in depth to contain components as small as eight (8) to ten (10) mils square by five (5) to six (6) mils thick, in addition to larger components ranging up to approximately 90% of the aperture cavity volume. Some of the normal ranges for the punched tape 12 thickness "D" and resulting aperture cavity depth is of the order of five (5) or six (6) mils at a shallow depth, and sixty (60) or seventy (70) mils for the thicker cavity material. The thickness "D" of the punched tape 12 may be greater than the thickness of the small component which is to be retained, or thickness "D" of the punched tape 12 may be substantially less than the thickness of the component to be retained, thereby allowing the retained component to protrude above the surface of punched tape 12, for certain automated handling and processing needs. The punched tape 12 can be made of plastic material.

The punched tape 12 can be used in high speed manufacturing processes, where a continuous reel of small components 26 are retained in the aperture cavities 22 and are sequentially indexed to a specific position or dead spot by the processing machinery. In order to feed the punched tape 12 forward, accurately indexing the punched tape 12 forward an exact distance, the punched tape 12 has sprocket drive holes 24 which engage gear teeth of a drive wheel or the probe of a lateral pawl of the processing machinery (typically, a tape feeder) and synchronizes the translation of the punched tape 12 with the action of other processing machinery such as the vacuum tip arm of a pick-and-place assembly system. The direction of forward feed is designated by an arrow "F" which the punched tape 12 moves during final assembly placement of the components contained therein.

The aperture cavity 22 is typically a vacant hexahedron region which has four enclosed sides. The four enclosed sides are: the left lateral side 30 and the right lateral side 32 which are lateral to the direction of forward feed "F"; a leading side 34 which is in the direction of forward feed "F"; and a trailing side 36 opposite to the direction of forward feed "F". By way of example, the geometry of the aperture cavity 22 may assume any convenient shape suitable for component retention, such as round or oval.

The longitudinal spacing between the longitudinal centerlines of one aperture cavity 22 to an adjacent aperture cavity 22 is shown as the pitch "P". The pitch "P" is set to adapt to the action of a carrier tape transport mechanism, typically a tape feeder used with a pick-and-place assembly system, and is governed by the "L" and "W" dimensions of the aperture cavity required to suitably contain the component therein.

Figure 4:
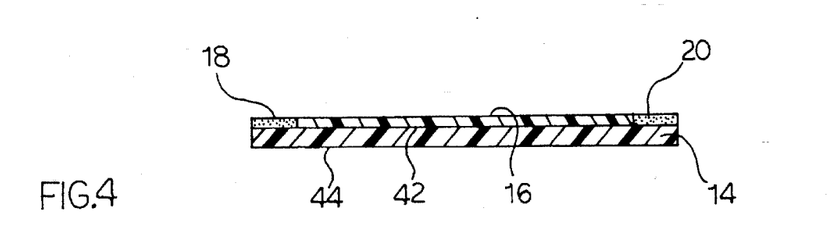
FIG. 4 is a cross-sectional view taken along line 4—4 of FIG. 2, showing a backing tape with a thin flexible gel layer affixed between two strips of parallel PSA material.

Referring to FIGS. 1, 2 and 4, the backing tape 14 has a front side 42 and a back side 44, and is usually made of polyester, polyvinyl chloride (PVC), or the like. The front side 42 of the backing tape 14 is used as a mounting surface for the two strips of PSA material 18 and 20, and the thin flexible gel layer 16. The two strips of PSA material 18 and 20 are aligned parallel to each other and are spaced apart by a middle gap portion 46 which runs in the longitudinal direction of the backing tape 14. The thin flexible gel layer 16 covers the entire gap portion 46 thereon. The two strips of parallel PSA material 18 and 20 are then affixed to the edges of the back side 40 of the punched tape 12 for binding the punched tape 12 and the backing tape 14 together to sandwich the gel layer 16, which in turn covers the aperture cavities 22. The flexible gel layer 16 can be applied onto the front side 42 of the backing tape 14 by coagulation of a sol (a colloidal dispersion of a liquid), by means of cooling, evaporation, or by precipitation with an electrolyte, or by any conventional means known to one skilled in the art, to provide a sealing engagement between the front side 42 of the backing tape 14 and the gel layer 16. Alternatively, the front side 42 of the backing tape 14 may contain a continuous coat of PSA material, over which a thin layer of gel may be applied with careful masking to confine the gel to the middle gap portion 46 only, thereby leaving exposure of the two strips of parallel PSA material 18 and 20. The backing tape 14 can be made of polyester material or made of polyvinyl chloride (PVC).

It will be appreciated that the present invention is not limited to the two strips of parallel PSA material 18 and 20. It is emphasized that while the two strips of parallel PSA material 18 and 20 is preferred, it is also within the spirit and scope of the present invention to utilize a thin flexible gel layer which is affixed to a backing tape and girded by two parallel stripes of Ethyl Vinl Acetate (EVA) material or equivalent and then heat sealed to the punched tape in the same conventional manner, as are cover film tapes used with conventional carrier tapes.

The backing tape 14 can also be affixed to the back side 40 of the punched tape 12 by ultra-sonic welding or fusion of the two material together.

Figure 5:
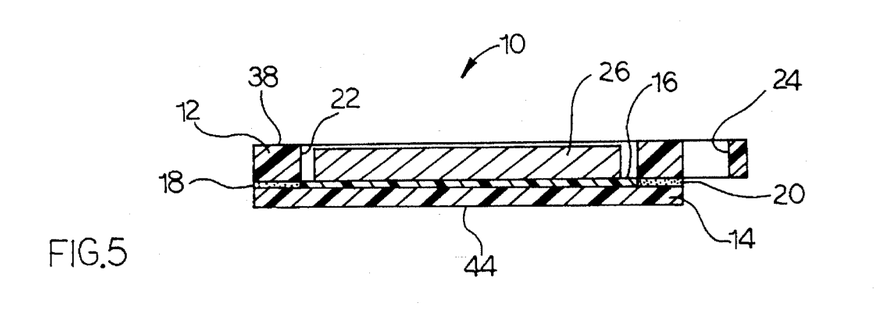
FIG. 5 is a cross-sectional view taken along line 5—5 of FIG. 1, showing the backing tape affixed to the punched tape by the two strips of PSA material and the small component is retained on the thin flexible gel layer within the aperture cavity.

FIG. 5 illustrates a cross-sectional view of the present invention carrier tape 10. Referring to FIGS. 4 and 5, when the small component 26 is placed into the aperture cavity 22 of the punched tape 12, the small component 26 is supported at the bottom of the aperture cavity 22 by the thin flexible gel layer 16 and the backing tape 14. The small component 26 has a width, a length and a depth. By way of example, the component may assume any shape independent of the shape of the aperture cavity 22, such as round or oval. The gel layer 16 is shown fixedly engaged to the front side 42 of the backing tape 14. The front side 42 of the backing tape 14 is then affixed to the back side 40 of the punched tape 12 such that the gel layer 16 is sandwiched therebetween and covers each of the aperture cavity 22.

The small component 26 is seated within the aperture cavity 22 with the gel layer 16 at the bottom of the aperture cavity 22 and the two strips of parallel PSA material 18 and 20 affixed on longitudinal edges of the back side 40 of the punched tape 12. The gel layer 16 comes in intimate contact with the underside of the small component 26 and it covers all of the underside surface area of the small component 26.

The flexible gel layer 16 has a minimum thickness of approximately five (5) mils for holding the small component 26 therein. The flexible gel layer 16 has a low peel adhesion but good resistance to shear movement. The gel layer 16 prevents the small component 26 from moving in the shear direction, but will offer minimum resistance to removal forces applied along the Z-axis. The characteristics of the gel layer 16 extend high resistance to shear forces (movements in X, Y and theta) yet minor resistance to peel forces (removal in the Z-axis), such that the gel layer 16 offers benefits beyond that of conventional pressure sensitive adhesive tapes for holding the small components within the aperture cavity 22 of the punched tape 12. The gel layer may be made of a curable liquid polymer. The small components 26 are placed upon the gel layer 16 and are in a fixed position, unable to move in the X, Y or theta directions, but can be readily removed in the Z-axis which is the peel direction. The walls or sides of the aperture cavity 22 do not serve to restrain movement of the component as is the case with conventional carrier tapes with heat sealed cover tapes. This condition provides two extremely important benefits: (a) the aperture cavity may be sized to accommodate a range of component sizes, permitting standardization and cost reduction in use of carrier tapes; and (b) the large size aperture cavity affords ready access for vacuum pick up probes and other mechanical pick-up means such as die collets and gripper jaws to enter the aperture cavity for optimum retrieval of the component, and without restriction by close in aperture cavity walls.

The present invention reduces the variation of mechanical stresses applied to the small components 26 by providing a more controlled manner of retaining and releasing the small components 26 within the aperture cavity 22 of the punched tape 12. Those who are skilled in the art of integrated circuit technology appreciate the reduction of manufacturing variance, at any stage of integrated circuit processing, because the overall reduction of variance leads to lower failure rates, higher overall yield, extended performance lifetimes and increased reliability of the fully functional integrated circuit when installed.

There are various gel formulations to insure that the small component 26 is held properly. The small component 26 position and orientation can be precisely defined, and maintained during handling and shipping. Automated handling of small components 26 is facilitated. The small components 26 are immobilized on the flexible gel layer 16 and spillage is avoided. Edge damage and breakage due to small component 26 movement is avoided.

Figure 6:
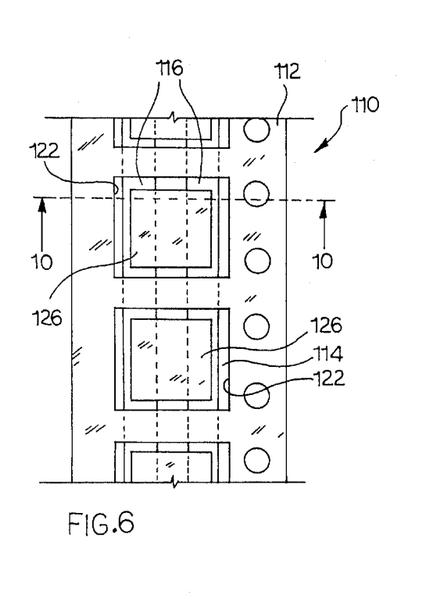
FIG. 6 is a top plan view of the carrier tape packaging system showing an embodiment where the small components are retained on two thin flexible gel layers within each aperture cavity of the punched tape.

Referring to FIG. 6, there is shown another embodiment of the present invention longitudinal carrier tape 110 which has small components or dies 126 fitted into a plurality of aperture cavity 122. All other components are the same and assembled as previously described in FIGS. 1 through 5, and the description thereof will not be repeated and only the modified components will be described in detail. In this embodiment, the components are numbered correspondingly with 100 added to each number.

Figure 10:
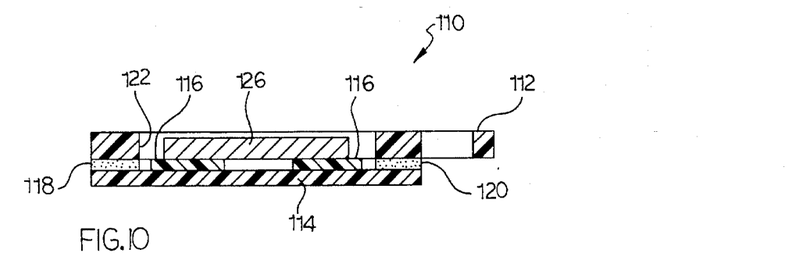
FIG. 10 is a cross-sectional view taken along line 10—10 of FIG. 6.

Referring to FIGS. 6 and 10, the carrier tape 110 includes a longitudinal punched tape 112, a longitudinal backing tape 114, two thin flexible gel layers 116 affixed to the backing tape 114, and a pair of strips of parallel spaced apart pressure sensitive adhesive material 118 and 120 affixed to the backing tape 114. The two thin flexible gel layers 116 are positioned in a substantially parallel and spaced apart relationship, and located between the pair of strips of parallel spaced apart pressure sensitive adhesive material 118 and 120. The two thin flexible gel layers 116 cover a portion of each aperture cavity 122 of the punched tape 112 for housing and retaining the small components 126.

Figure 7:
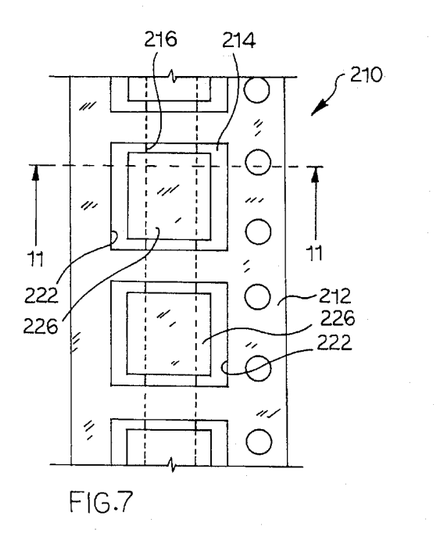
FIG. 7 is a top plan view of the carrier tape packaging system showing an embodiment where the small components are retained on a narrower thin flexible gel layer within each aperture cavity of the punched tape.

Referring to FIG. 7, there is shown still another embodiment of the present invention longitudinal carrier tape 210 which has small components or dies 226 fitted into a plurality of aperture cavities 222. All other components are the same and assembled as previously described in FIGS. 1 through 5, and the description thereof will not be repeated and only the modified components will be described in detail. In this embodiment, the components are numbered correspondingly with 200 added to each number.

Figure 11:
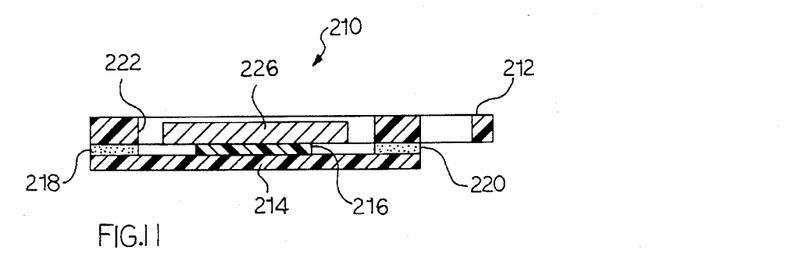
FIG. 11 is a cross-sectional view taken along line 11—11 of FIG. 7.

Referring to FIGS. 7 and 11, the carrier tape 210 includes a longitudinal punched tape 212, a longitudinal backing tape 214, a narrower thin flexible gel layer 216 affixed to the backing tape 214, and a pair of strips of parallel spaced apart pressure sensitive adhesive material 218 and 220 affixed to the backing tape 214. The narrower thin flexible gel layer 216 are located between the pair of strips of parallel spaced apart pressure sensitive adhesive material 218 and 220. The narrower thin flexible gel layer 216 covers a portion of each aperture cavity 222 of the punched tape 212 for housing and retaining the small components 226. In this embodiment, the small components 226 are wider than the flexible gel layer 216.

Figure 8:
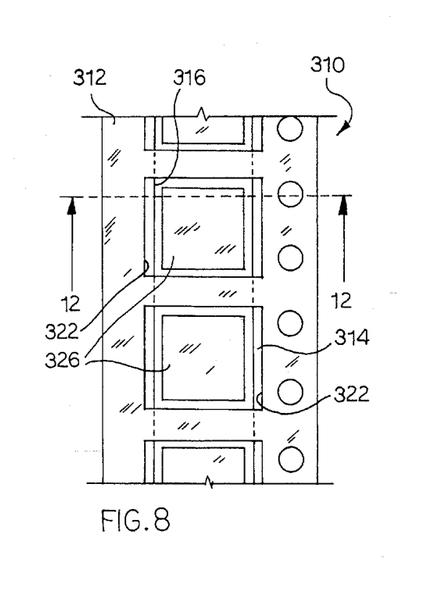
FIG. 8 is a top plan view of the carrier tape packaging system showing an embodiment where the small components are retained on a wider thin flexible gel layer within each aperture cavity of the punched tape.

Referring to FIG. 8, there is shown a further embodiment of the present invention longitudinal carrier tape 310 which has small components or dies 326 fitted into a plurality of aperture cavities 322. All other components are the same and assembled as previously described in FIGS. 1 through 5, and the description thereof will not be repeated and only the modified components will be described in detail. In this embodiment, the components are numbered correspondingly with 300 added to each number.

Figure 12:
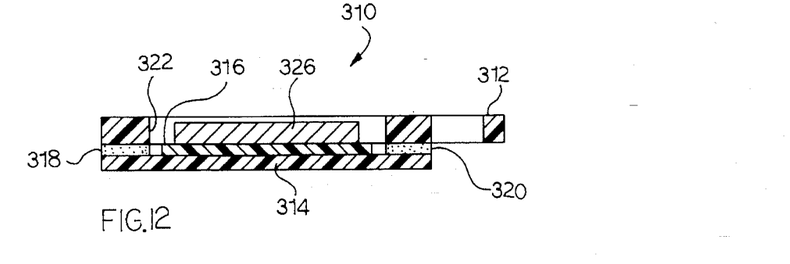
FIG. 12 is a cross-sectional view of taken along line 12—12 of FIG. 8.

Referring to FIGS. 8 and 12, the carrier tape 310 includes a longitudinal punched tape 312, a longitudinal backing tape 314, a wider thin flexible gel layer 316 affixed to the backing tape 314, and a pair of strips of parallel spaced apart pressure sensitive adhesive material 318 and 320 affixed to the backing tape 314. The wider thin flexible gel layer 316 is located between the pair of strips of parallel spaced apart pressure sensitive adhesive material 318 and 320. The wider thin flexible gel layer 316 covers a portion of each aperture cavity 322 of the punched tape 312 for housing and retaining the small components 326. In this embodiment, the small components 326 are narrower than the flexible gel layer 316.

Figure 9:
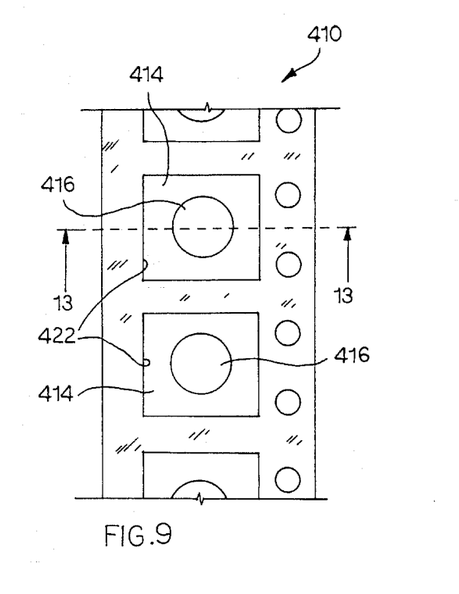
FIG. 9 is a top plan view of the carrier tape packaging system showing an embodiment where each aperture cavity of the punched tape has a discrete thin flexible gel for retaining the small components.

Referring to FIG. 9, there is shown still a further embodiment of the present invention longitudinal carrier tape 410. All other components are the same and assembled as previously described in FIGS. 1 through 5, and the description thereof will not be repeated and only the modified components will be described in detail. In this embodiment, the components are numbered correspondingly with 400 added to each number.

Figure 13:
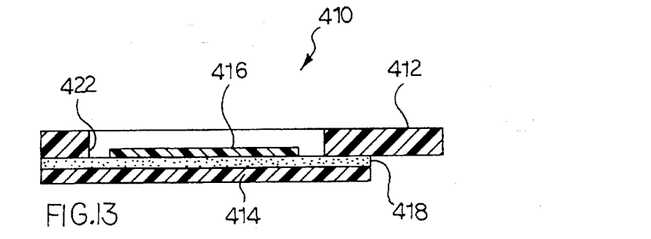
FIG. 13 is a cross-sectional view of taken along line 13—13 of FIG. 9.

Referring to FIGS. 9 and 13, the carrier tape 410 includes a longitudinal punched tape 412 with a plurality of aperture cavities 422, a longitudinal backing tape 414, a series of discrete thin flexible gel 416, and a strip of pressure sensitive adhesive material 418 affixed to the entire side of the backing tape 414. The series of discrete thin flexible gel 416 are affixably disposed on the pressure sensitive adhesive material 418 within each aperture cavity 422 of the punched tape 412. Each discrete thin flexible gel 416 covers a portion of each aperture cavity 422 of the punched tape 412 for housing and retaining the small components.

Figure 14:
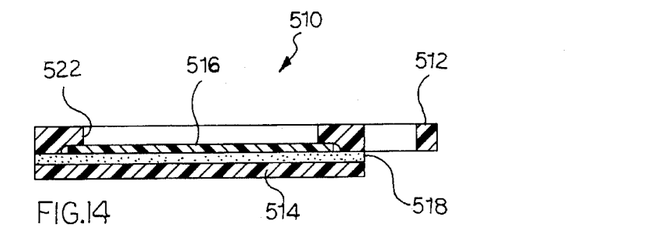
FIG. 14 is a cross-sectional view of the carrier tape packaging system showing an embodiment where only one strip of PSA material is affixed to the entire side of the backing tape and a wider thin flexible gel layer is affixed to the PSA material, which covers each of the entire aperture cavity of the punched tape.

Referring to FIG. 14, there is shown an additional embodiment of the present invention longitudinal carrier tape 510. All other components are the same and assembled as previously described in FIGS. 1 through 5, and the description thereof will not be repeated and only the modified components will be described in detail. In this embodiment, the components are numbered correspondingly with 500 added to each number.

The carrier tape 510 includes a longitudinal punched tape 512 with a plurality of aperture cavities 522 (only one is shown), a longitudinal backing tape 514, a thin flexible gel layer 516, and a strip of pressure sensitive adhesive material 518 affixed to the entire side of the backing tape 514. The series of discrete thin flexible gel 416 are affixedly disposed within each of the aperture cavity 422 of the punched tape 412. Each discrete thin flexible gel 416 covers a portion of each of the aperture cavity 422 of the punched tape 412 for housing and retaining the small components.

Figure 15:
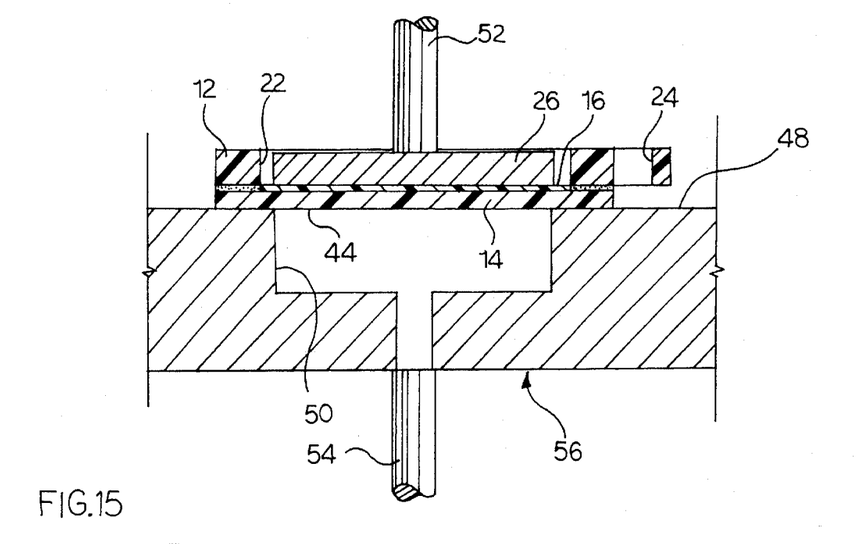
FIG. 15 is a cross-sectional view of the present invention carrier tape packaging system which is used in conjunction with an automated assembly machine having an upper vacuum source means and a lower vacuum source means.

Referring to FIG. 15, there is shown a partial cross-sectional view of a method for releasing the small component 26 from the flexible gel layer 16. An illustration of a pick-and-place vacuum chamber 56 is shown in its initial position for loosening die 26 for quick and safe removal. The vacuum chamber 56 is fitted as the base of the component pick point on the tape feeder mechanism. The vacuum chamber 56 has a flat planar surface 48 with a recessed cavity 50. The flat planar surface 48 of the vacuum chamber 56 assures an airtight seal against the back side 44 of the backing tape 14 positioned thereon. The vacuum chamber 56 functions in conjunction with an upper vacuum pipette or mechanical pick-up means 52, together with means for exhausting air from the recessed cavity 50. The recessed cavity 50 is open to atmosphere, thereby allowing equal atmospheric pressure forces to be equally applied to both sides of the composite gel layer 16 with the backing tape 14.

Figure 16:
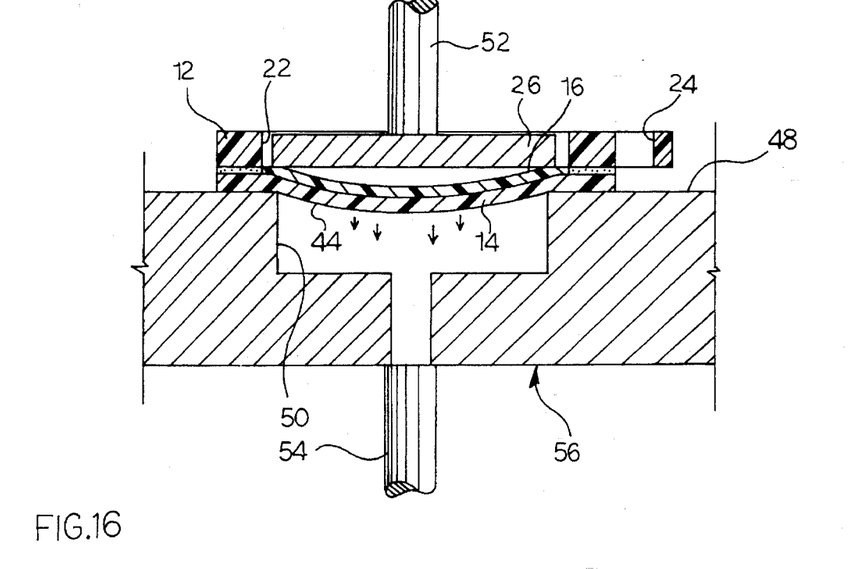
FIG. 16 is a cross-sectional view of the present invention carrier tape packaging system which is used in conjunction with an automated assembly machine having an upper vacuum source means and a lower vacuum source means for withdrawing the backing tape into a recess cavity such that the thin flexible gel layer is distorted and withdrawn from the small component to facilitate removal of the small component from the aperture cavity by the upper vacuum source means.

Referring to FIG. 16, there is shown a partial cross-sectional view of a method for releasing the small component 26 from the flexible gel layer 16. The recessed cavity 50 has been partially exhausted of air by a vacuum source means, thereby causing deflection of the flexible gel layer 16 with the attached backing tape 14 as shown. With atmospheric pressure greater on the upper surface of the flexible gel layer 16 than the reduced pressure in the partially exhausted recessed cavity 50 as applied to the back side 44 of the backing tape 14, deflection of the flexible gel layer 16 with the attached backing tape 14 will occur, as shown. The small component 26 can be released 'on demand' by simply activating the lower vacuum source 54 to partially exhaust the recessed cavity 50 beneath the backing tape 14 within the aperture cavity 22 positioned at the dead spot component pickup point. The hold/release mechanism is reversible; the gel layer 16 returns to its original flat full holding position as shown in FIG. 15 when the recessed cavity 50 is reopened to atmosphere and the carrier tape is advanced to position the following sequential aperture cavity containing a component immediately above the recessed cavity 50, ready for the next cycle to repeat. The vacuum chamber 56 serves to allow the flexible gel layer 16 to be alternately drawn down into the recessed cavity 50 by partial vacuum and then subsequently released when the recessed cavity 50 is reopened to atmospheric pressure. The recess cavity 50 is situated and defined as the pick point for pick-and-place assembly.

To release the small component 26 from the gel layer 16, the recessed cavity 50 immediately beneath the backing tape 14 covering the lower surface of the aperture cavity containing the component to be picked is partially exhausted of air by means of a vacuum source means 54 which causes the flexible gel layer 16 to deform as it is uniformly drawn down into the cavity recess 50 of the pick-and-place vacuum chamber 56 directly beneath it. The gel layer 16 is distorted so that the majority of its surface is drawn away from the small component 26, reducing peel adhesion force dramatically and thus facilitating pickup of the component 26 by the upper vacuum means 52 without push-up pin assistance. The pick-up force of the upper vacuum means 52 or alternative mechanical pickup means is sufficient to readily pick the small component 26 vertically for transfer to its assembly destination (generally a circuit board/substrate).

The gel layer 16 is in intimate contact with the die 26 and the surface contact between them is maximized, such that the die 26 are held firmly in place. To release the die 26, the surface contact is minimized by drawing the gel layer 16 downward over the recess cavity 50 at the pick point of the pick-and-place assembly and away from the die 26.

The flexible gel layer 16 can capture chip dust fragments and other foreign matter created when IC wafers are sawn into individual die. Such retention avoids clogging of tiny orifice vacuum probes used for die pickup and transfer. The flexible gel layer 16 affixed to backing tape 14 also serves as cushioning arrangement for the small components 26 and acts to absorb and dissipate shock and vibration forces which can occur during reeling and de-reeling and automated transport of the carrier tape with components 26 installed. The flexible gel layer 16 is secured directly to the front side 42 of the flexible backing tape 14. Once a die or other small flat component makes full surface contact with the gel layer 16, it is held firmly in place until removed by vacuum means or alternative mechanical means.

The degree to which dies or other flat components are held on the gel layer 16 is primarily determined by the surface smoothness of the die or other flat component, rather than the "adhesiveness" of the gel layer 16. In point of fact, the gel layer 16 is not an adhesive nor does it have an adhesive coating on its upper surface. It is a soft, rubbery, resilient, translucent non-adhesive elastomeric flat flexible film which is applied to the backing tape 14. These rubbery no-tack or low-tack materials depend primarily upon total surface contact with the die or other smooth surface component for their holding action. The more uniform and complete contact made, the better the die or other component 26 is held in place. It is apparent that in order for die to be held securely on the gel layer 16, good surface contact is required. Several gel retention levels are attainable, depending upon surface smoothness or lack thereof. It is possible to control the surface smoothness of the gel and often of the component die itself to achieve optimum adhesion. In point of fact, back grinding of full IC wafers can be controlled to produce varied surface textures to optimize adhesion to the gel. Any air space, or pockets of air, however small, between the gel and the die component surfaces will reduce holding power of the bond between gel and die component.

Integrated circuit chips or die often have a thin layer of glass passivation at the exposed surface and at the exposed metal bond pad region when the die is ready for assembly placement. Small disturbances to the surface of the IC die or mechanical stress imperfections due to handling can negatively impact the quality and the functionality of the die when assembled and connected to its substrate. The configuration of the invention herein described has been arranged with full regard for the foregoing and to afford maximum protection for each die.

Integrated circuits are commonly stored and processed in the carrier tape with the backing tape arrangement, in lieu of a gel. Such PSA backing tape arrangements require the use of a poke-up needle to aid in release of the small components.

One of the unique features of the present invention carrier tape 10 is that the punched tape 12 does not require a poke-up needle for removal of the small components 26.

In general, the procedure for packaging the small components 26 using the punched tape 12 and the backing tape 14 with the flexible gel layer 16 affixed thereon and between two strips of PSA material 18 and 20 is as follows. First, the punched tape 12 is prepared with a plurality of aperture cavities 22 which are large enough to contain the small components 26. The two strips of PSA material 18 and 20 are affixed to the front side 42 of the backing tape 14 with the gap portion 46 separating the two strips of PSA material 18 and 20. The gel layer 16 is affixed to the gap portion 46. The backing tape 14 is affixed to the back side 40 of the punched tape 12 such that the gel layer 16 is sandwiched therebetween and covers each aperture cavity 22. A complete carrier tape 10, less components, has thus been assembled as shown in FIG. 1.

The completed carrier tape 10 is next wound in predetermined lengths onto a supply reel and fed into a carrier tape transport mechanism, akin to a tape feeder, whereby the carrier tape may be precisely indexed incrementally to sequentially position each aperture cavity 22 at a predetermined placement position, aka dead spot. A die transfer system, commonly referred to as a die attach or die sorting machine is employed to transfer bare die from a full IC wafer which has been previously sawn to singulate each die within the wafer. Typically, an array of die eject needles are used to release individual die from the adhesive backing covering the entire back side of the sawn wafer. Plunge-up of the die eject needles is synchronized with action of a vacuum probe or alternate mechanical means to pick the singulated die from the IC wafer array and transport the die with an appropriate transfer arm supporting the vacuum probe with die affixed thereto and to position the die directly above the dead spot placement position where the die is then precisely placed within the aperture cavity 22 of the carrier tape and fixed with a preset downward force to firmly seat the die onto the surface of the gel.

After the small components 26 are placed into the aperture cavities 22, the small components 26 are in position for further processing and assembly placement. Subsequently, the component will be positioned for ready release and removal from the aperture cavity 22 by means of the vacuum pipette or other mechanical lifting means at a fixed pick point.

The present invention is not limited to usage with integrated circuits. Surface mount components in general and other very small flat components such as bond pads and weld pads could benefit from the implementation of a backing tape having a thin flexible gel layer between a pair of strips of parallel PSA material and used in conjunction with the carrier tape for packaging. The carrier tape can be wound on a reel from which it can be unwound for subsequent use.

The present invention carrier tape packaging system is used for orderly sequential arrangements of small flat components or the like, especially electronic components for automated surface mount assembly. In particular, singulated bare die is obtained from sawn integrated circuit wafers in preparation for further testing, inspection, marking or other processing if and as required, and, ultimately, for assembly/placement upon circuit board substrates by high speed automated pick-and-place means. In its particular application with singulated bare die, the gel layer carrier tape herein described with die components in place within aperture cavities comprise a sanitized sawn IC wafer containing only those die of pretested known good quality, rearranged in convenient tape and reel format. Therefore, it enables large quantities of many different types and functions of die to be positioned compactly side by side in tape feeder banks on a pick-and-place assembly machine for orderly, high-speed selection and placement while, simultaneously, protecting die from damage by eliminating the need for poke-up needles to release die from pressure sensitive adhesive substrates.

The present invention carrier tape packaging system comprises an improved means and method for automated handling and processing of small flat surface mount components. It includes but is not limited to IC wafer die, in a convenient, ready-for-use tape and reel format, and enabling long term storage under fluctuating environmental conditions without detriment to subsequent undamaged component retrieval.

The carrier tape is a convenient, safe and efficient means for packaging singulated bare IC die for subsequent testing, processing and highly automated assembly/placement.

Defined in detail, the present invention is a longitudinal carrier tape for receiving, retaining and releasing small components for subsequent automated assembly, the carrier tape comprising: (a) a punched tape having a front side, a back side and a plurality of longitudinally spaced apart aperture cavities, where each aperture cavity extends from the front side through the back side of the punched tape; (b) a non-porous, air impermeable backing tape having a front side and a back side; (c) a pair of strips of pressure sensitive adhesive material affixed to said front side of said backing tape in a spaced apart relationship and defining a longitudinal gap portion on said front side of said backing tape located between the pair of strips of pressure sensitive adhesive material; (d) a thin resilient gel layer affixed on said gap portion of said backing tape; and (e) said pair of strips of pressure sensitive adhesive material affixed to said back side of said punched tape for binding said punched tape and said backing tape together to sandwich said gel layer, which in turn covers each said aperture cavity for receiving and retaining said small components; (f) whereby said small components can be placed into said plurality of aperture cavities from said front side of said punched tape respectively and retained therein by said flexible gel layer.

Defined broadly, the present invention is a longitudinal carrier tape for housing and retaining small components for subsequent automated assembly, the carrier tape comprising: (a) a punched tape having a front side, a back side and a plurality of longitudinally spaced apart aperture cavities, where each aperture cavity extends from the front side through the back side of the punched tape; (b) a backing tape having a front side and a back side; (c) a resilient gel layer affixed on said front side of said backing tape and defining two opposite longitudinal edges on said backing tape which do not have the resilient gel layer; and (d) means for binding said two longitudinal edges of said backing tape to said back side of said punched tape together to sandwich said gel layer, which in turn covers a portion of each said aperture cavity for housing and retaining said small components; (e) whereby said small components can be placed into said plurality of aperture cavities from said front side of said punched tape respectively and retained therein by said flexible gel layer.

Defined alternatively broadly, the present invention is a longitudinal carrier tape for housing and retaining small components for subsequent automated assembly, the carrier tape comprising: (a) a punched tape having a front side, a back side and a plurality of longitudinally spaced apart aperture cavities, where each aperture cavity extends from the front side through the back side of the punched tape; (b) a backing tape having a front side and a back side; (c) at least two resilient gel layers affixed on said front side of said backing tape and positioned in a substantially parallel and spaced apart relationship, which define two opposite longitudinal edges on said backing tape which do not have the at least two resilient gel layers; and (d) means for binding said two longitudinal edges of said backing tape to said back side of said punched tape together to sandwich said at least two gel layers, which in turn cover a portion of each said aperture cavity for housing and retaining said small components; (e) whereby said small components can be placed into said plurality of aperture cavities from said front side of said punched tape respectively and retained therein by said at least two flexible gel layers.

Defined further alternatively broadly, the present invention is a longitudinal carrier tape for housing and retaining small components for subsequent automated assembly, the carrier tape comprising: (a) a punched tape having a front side, a back side and a plurality of longitudinally spaced apart aperture cavities, where each aperture cavity extends from the front side through the back side of the punched tape; (b) a backing tape having a front side and a back side; (c) means for binding said front side of said backing tape to said back side of said punched tape; and (d) a series of resilient discrete gel layers affixed to said front side of said backing tape and located in each said aperture cavity of said punched tape for housing and retaining said small components within said plurality of aperture cavities respectively; (e) whereby said small components can be placed into said plurality of aperture cavities from said front side of said punched tape respectively and retained therein by said series of resilient discrete gel layers.

Defined more broadly, the present invention is a carrier tape for housing and retaining small components, comprising: (a) a punched tape having a plurality of apertures; (b) a backing tape having at least one gel layer for retaining said small components in intimate surface contact with the at least one gel layer; and (c) means for affixing said backing tape to said punched tape such that said at least one gel layer is sandwiched therebetween and covers at least a portion of each of said apertures; (d) whereby said small components can be placed into said plurality of apertures of said punched tape respectively and retained therein by said at least one gel layer.

The present invention can also be defined in detail as a method of releasing small components for use in an automated packaging, the method comprising the steps of: (a) preparing a longitudinal punched tape having a front side, a back side and a plurality of longitudinally spaced apart aperture cavities, where each aperture cavity extends from the front side through the back side of said punched tape; (b) providing a non-porous, air impermeable backing tape having a front side and a back side; (c) affixing a pair of strips of pressure sensitive adhesive material to said front side of said backing tape in a spaced apart relationship and defining a longitudinal gap portion on said front side of said backing tape located between the pair of strips of pressure sensitive adhesive material; (d) sealing a thin resilient gel layer on said gap portion of said backing tape; (e) affixing said pair of strips of pressure sensitive adhesive material to said back side of said punched tape for binding said punched tape and said backing tape together to sandwich said gel layer, which in turn covers each said aperture cavity for receiving, retaining and releasing said small components; and (f) using a pick-and-place assembly machine with a vacuum chamber fitted as a base of the component pick point and having a lower vacuum source, an upper vacuum source and a recess cavity, the lower vacuum source exhausting air from the recess cavity for withdrawing said back side of said backing tape into the recess cavity to deform said resilient gel layer from said small component, thereby releasing said small component from said gel layer, and reducing peel adhesion force dramatically thereby enabling pickup by the upper vacuum source for transferring to an assembly destination.

The present invention can also be defined broadly as a method of releasing small components for use in an automated packaging, the method comprising the steps of: (a) preparing a punched tape having a plurality of apertures; (b) affixing a gel layer on a backing tape for retaining said small components in intimate surface contact with the gel layer; (c) affixing said backing tape to said punched tape such that said gel layer is sandwiched therebetween and covers each said aperture; and (d) using a pick-and-place assembly machine having a lower vacuum means, an upper vacuum means and a recess cavity, the lower vacuum means exhausting air from the recess cavity for withdrawing said backing tape into the recess cavity to deform said gel layer from said small component, thereby releasing said small component from said gel layer, and reducing peel adhesion force dramatically thereby enabling pickup by the upper vacuum means for transferring to its assembly destination.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus and method shown is intended only for illustration and for disclosure of an operative embodiment and not to show all of the various forms or modifications in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A longitudinal carrier tape for receiving, retaining and releasing small components for subsequent automated assembly, the carrier tape comprising:

a. a punched tape having a front side, a back side and a plurality of longitudinally spaced apart aperture cavities, where each aperture cavity extends from the front side through the back side of the punched tape;

b. a non-porous, air impermeable backing tape having a front side and a back side;

c. a pair of strips of pressure sensitive adhesive material affixed to said front side of said backing tape in a spaced apart relationship and defining a longitudinal gap portion on said front side of said backing tape located between the pair of strips of pressure sensitive adhesive material;

d. a thin resilient gel layer affixed on said gap portion of said backing tape; and e. said pair of strips of pressure sensitive adhesive material affixed to said back side of said punched tape for binding said punched tape and said backing tape together to sandwich said gel layer, which in turn covers each said aperture cavity for receiving and retaining said small components;

f. whereby said small components can be placed into said plurality of aperture cavities from said front side of said punched tape respectively and retained therein by said flexible gel layer.

2. The longitudinal carrier tape as defined in claim 1 further comprising sprocket drive holes to engage gear teeth of a drive wheel or similar engaging mechanism and translate said carrier tape in synchronization with the drive of an automated assembly machine.

3. The longitudinal carrier tape as defined in claim 1 wherein said punched tape is made of plastic material.

4. The longitudinal carrier tape as defined in claim 1 wherein said backing tape is made of polyester material.

5. The longitudinal carrier tape as defined in claim 1 wherein said backing tape is made of polyvinyl chloride (PVC).

6. The longitudinal carrier tape as defined in claim 1 wherein said thin resilient gel layer is made of a curable liquid polymer.

7. The longitudinal carrier tape as defined in claim 1 wherein said small components are integrated circuit chips or die.

8. The longitudinal carrier tape as defined in claim 1 wherein said small components are surface mount components.

9. The longitudinal carrier tape as defined in claim 1 wherein said carrier tape can be wound on a reel from which it can be unwound for subsequent use.

10. The longitudinal carrier tape as defined in claim 1 wherein said back side of said backing tape can be withdrawn by a lower vacuum source means to deform said resilient gel layer from said small component for releasing said small component to facilitate removal from said carrier tape.

11. A longitudinal carrier tape for housing and retaining small components for subsequent automated assembly, the carrier tape comprising:

a. a punched tape having a front side, a back side and a plurality of longitudinally spaced apart aperture cavities, where each aperture cavity extends from the front side through the back side of the punched tape;

b. a backing tape having a front side and a back side;

c. a resilient gel layer affixed on said front side of said backing tape and defining two opposite longitudinal edges on said backing tape which do not have the resilient gel layer; and d. means for binding said two longitudinal edges of said backing tape to said back side of said punched tape together to sandwich said gel layer, which in turn covers a portion of each said aperture cavity for housing and retaining said small components;

e. whereby said small components can be placed into said plurality of aperture cavities from said front side of said punched tape respectively and retained therein by said flexible gel layer.

12. The longitudinal carrier tape as defined in claim 11 wherein said carrier tape has sprocket drive holes to engage gear teeth of a drive wheel or similar engaging mechanism and translate said carrier tape in synchronization with the drive of an automated assembly machine.

13. The longitudinal carrier tape as defined in claim 11 wherein said punched tape is made of plastic material.

14. The longitudinal carrier tape as defined in claim 11 wherein said backing tape is made of polyester material.

15. The longitudinal carrier tape as defined in claim 11 wherein said resilient gel layer is made of a curable liquid polymer.

16. The longitudinal carrier tape as defined in claim 11 wherein said small components are integrated circuit chips or die.

17. The longitudinal carrier tape as defined in claim 11 wherein said small components are surface mount components.

18. The longitudinal carrier tape as defined in claim 11 wherein said punched tape can be wound on a reel from which it can be unwound for subsequent use.

19. The longitudinal carrier tape as defined in claim 11 wherein said means for binding said two longitudinal edges of said backing tape to said back side of said punched tape is two strips of pressure sensitive adhesive material.

20. The longitudinal carrier tape as defined in claim 11 wherein said means for binding said two longitudinal edges of said backing tape to said back side of said punched tape is two strips of ethyl vinl acetate material.

21. The longitudinal carrier tape as defined in claim 11 wherein said means for binding said two longitudinal edges of said backing tape to said back side of said punched tape is by ultra-sonic welding.

22. A longitudinal carrier tape for housing and retaining small components for subsequent automated assembly, the carrier tape comprising:

a. a punched tape having a front side, a back side and a plurality of longitudinally spaced apart aperture cavities, where each aperture cavity extends from the front side through the back side of the punched tape;

b. a backing tape having a front side and a back side;

c. at least two resilient gel layers affixed on said front side of said backing tape and positioned in a substantially parallel and spaced apart relationship, which define two opposite longitudinal edges on said backing tape which do not have the at least two resilient gel layers; and d. means for binding said two longitudinal edges of said backing tape to said back side of said punched tape together to sandwich said at least two gel layers, which in turn cover a portion of each said aperture cavity for housing and retaining said small components;

e. whereby said small components can be placed into said plurality of aperture cavities from said front side of said punched tape respectively and retained therein by said at least two flexible gel layers.

23. The longitudinal carrier tape as defined in claim 22 wherein said punched tape is made of plastic material.

24. The longitudinal carrier tape as defined in claim 22 wherein said backing tape is made of polyester material.

25. The longitudinal carrier tape as defined in claim 22 wherein said at least two resilient gel layers are made of curable liquid polymer.

26. The longitudinal carrier tape as defined in claim 22 wherein said punched tape can be wound on a reel from which it can be unwound for subsequent use.

27. The longitudinal carrier tape as defined in claim 22 wherein said means for binding said two longitudinal edges of said backing tape to said back side of said punched tape is two strips of pressure sensitive adhesive material.

28. The longitudinal carrier tape as defined in claim 22 wherein said means for binding said two longitudinal edges of said backing tape to said back side of said punched tape is two strips of ethyl vinl acetate material.

29. The longitudinal carrier tape as defined in claim 22 wherein said means for binding said two longitudinal edges of said backing tape to said back side of said punched tape is by ultra-sonic welding.

30. A longitudinal carrier tape for housing and retaining small components for subsequent automated assembly, the carrier tape comprising:
 a. a punched tape having a front side, a back side and a plurality of longitudinally spaced apart aperture cavities, where each aperture cavity extends from the front side through the back side of the punched tape;
 b. a backing tape having a front side and a back side;
 c. means for binding said front side of said backing tape to said back side of said punched tape; and
 d. a series of resilient discrete gel layers affixed to said front side of said backing tape and located in each said aperture cavity of said punched tape for housing and retaining said small components within said plurality of aperture cavities respectively;
 e. whereby said small components can be placed into said plurality of aperture cavities from said front side of said punched tape respectively and retained therein by said series of resilient discrete gel layers.

31. The longitudinal carrier tape as defined in claim 30 wherein said punched tape is made of plastic material.

32. The longitudinal carrier tape as defined in claim 30 wherein said backing tape is made of polyester material.

33. The longitudinal carrier tape as defined in claim 30 wherein said series of resilient discrete gel layers are made of liquid polymer.

34. The longitudinal carrier tape as defined in claim 30 wherein said punched tape can be wound on a reel from which it can be unwound for subsequent use.

35. The longitudinal carrier tape as defined in claim 30 wherein said means for binding said front side of said backing tape to said back side of said punched tape is two strips of pressure sensitive adhesive material.

36. The longitudinal carrier tape as defined in claim 30 wherein said means for binding said front side of said backing tape to said back side of said punched tape is two strips of ethyl vinl acetate material.

37. The longitudinal carrier tape as defined in claim 30 wherein said means for binding said front side of said backing tape to said back side of said punched tape is by ultra-sonic welding.

38. A carrier tape for housing and retaining small components, comprising:
 a. a punched tape having a plurality of apertures;
 b. a backing tape having at least one gel layer for retaining said small components in intimate surface contact with the at least one gel layer; and
 c. means for affixing said backing tape to said punched tape such that said at least one gel layer is sandwiched therebetween and covers at least a portion of each of said apertures;
 d. whereby said small components can be placed into said plurality of apertures of said punched tape respectively and retained therein by said at least one gel layer.

39. The carrier tape as defined in claim 38 wherein said means for affixing said backing tape to said punched tape is at least two strips of pressure sensitive adhesive material which are located on opposite sides of said at least one gel layer.

40. The carrier tape as defined in claim 38 wherein said means for affixing said backing tape to said punched tape is at least two strips of ethyl vinl acetate material which are located on opposite sides of said at least one gel layer.

41. The carrier tape as defined in claim 38 wherein said means for affixing said backing tape to said punched tape is by ultra-sonic welding.

42. A method of releasing small components for use in an automated packaging, the method comprising the steps of:
 a. preparing a longitudinal punched tape having a front side, a back side and a plurality of longitudinally spaced apart aperture cavities, where each aperture cavity extends from the front side through the back side of said punched tape;
 b. providing a non-porous, air impermeable backing tape having a front side and a back side;
 c. affixing a pair of strips of pressure sensitive adhesive material to said front side of said backing tape in a spaced apart relationship and defining a longitudinal gap portion on said front side of said backing tape located between the pair of strips of pressure sensitive adhesive material;
 d. sealing a thin resilient gel layer on said gap portion of said backing tape;
 e. affixing said pair of strips of pressure sensitive adhesive material to said back side of said punched tape for binding said punched tape and said backing tape together to sandwich said gel layer, which in turn covers each said aperture cavity for receiving, retaining and releasing said small components; and
 f. using a pick-and-place assembly machine with a vacuum chamber fitted as a base of the component pick point and having a lower vacuum source, an upper vacuum source and a recess cavity, the lower vacuum source exhausting air from the recess cavity for withdrawing said back side of said backing tape into the recess cavity to deform said resilient gel layer from said small component, thereby releasing said small component from said gel layer, and reducing peel adhesion force dramatically thereby enabling pickup by the upper vacuum source for transferring to an assembly destination.

43. A method of releasing small components for use in an automated packaging, the method comprising the steps of:
 a. preparing a punched tape having a plurality of apertures;
 b. affixing a gel layer on a backing tape for retaining said small components in intimate surface contact with the gel layer;
 c. affixing said backing tape to said punched tape such that said gel layer is sandwiched therebetween and covers each said aperture; and
 d. using a pick-and-place assembly machine having a lower vacuum means, an upper vacuum means and a recess cavity, the lower vacuum means exhausting air from the recess cavity for withdrawing said backing tape into the recess cavity to deform said gel layer from said small component, thereby releasing said small component from said gel layer, and reducing peel adhesion force dramatically thereby enabling pickup by the upper vacuum means for transferring to its assembly destination.

* * * * *